US012648126B2

(12) United States Patent
Ning et al.

(10) Patent No.: US 12,648,126 B2
(45) Date of Patent: Jun. 2, 2026

(54) MEMORY CELL CAPACITOR STRUCTURES FOR THREE-DIMENSIONAL MEMORY ARRAYS

(71) Applicant: Micron Technology, Inc., Boise, ID (US)

(72) Inventors: Sheyang Ning, San Jose, CA (US); Song Guo, Boise, ID (US); Yuan He, Boise, ID (US)

(73) Assignee: Micron Technology, Inc., Bosie, ID (US)

( * ) Notice: Subject to any disclaimer, the term of this patent is extended or adjusted under 35 U.S.C. 154(b) by 793 days.

(21) Appl. No.: 17/830,145

(22) Filed: Jun. 1, 2022

(65) Prior Publication Data

US 2023/0397401 A1     Dec. 7, 2023

(51) Int. Cl.
H10B 12/00          (2023.01)
G11C 5/02            (2006.01)

(52) U.S. Cl.
CPC .............. H10B 12/30 (2023.02); G11C 5/02 (2013.01); H10B 12/03 (2023.02)

(58) Field of Classification Search
CPC .......... G11C 5/02; H10B 12/03; H10B 12/09; H10B 12/30; H10B 12/315; H10B 12/488; H10B 12/50
See application file for complete search history.

(56) References Cited

U.S. PATENT DOCUMENTS

| | | | | |
|---|---|---|---|---|
| 5,103,276 A | * | 4/1992 | Shen ................... | H10B 12/0383 |
| | | | | 257/302 |
| 5,350,484 A | * | 9/1994 | Gardner ............ | H01L 21/32136 |
| | | | | 257/E21.582 |
| 9,698,272 B1 | * | 7/2017 | Ikeda ................ | H01L 29/78642 |
| 2019/0103406 A1 | * | 4/2019 | Tang ................ | H01L 29/78618 |
| 2021/0391331 A1 | * | 12/2021 | Lin .................... | H01L 29/42392 |
| 2022/0077156 A1 | * | 3/2022 | Choi .................... | H10B 12/482 |

* cited by examiner

*Primary Examiner* — Britt Hanley
*Assistant Examiner* — Kevin Quinto
(74) *Attorney, Agent, or Firm* — Holland & Hart LLP

(57)          ABSTRACT

Methods, systems, and devices for memory cell capacitor structures for three-dimensional memory arrays are described. A memory device may include a memory array including multiple levels of memory cells that are each separated from another level by a respective dielectric layer. A memory cell at a first level of the memory array may include a channel portion and a capacitor operable to store a logic state of the memory cell. A first portion of the capacitor may be located between the channel portion and a voltage source coupled with the memory cell. A second portion of the capacitor may be in a cavity in a dielectric layer between the first level and a second level of the memory array. The second portion of the capacitor may be located between the channel portion and a word line coupled with a channel portion of a second memory cell at the second level.

23 Claims, 7 Drawing Sheets

335

315-a 340-a 312-a 313-a 345-a 315-b 340-b 312-b 313-b 345-b 300-b 355-a  360-a  365-a 350-a 360-b  365-b 350-b 355-b

370

300-c

Figure 5:
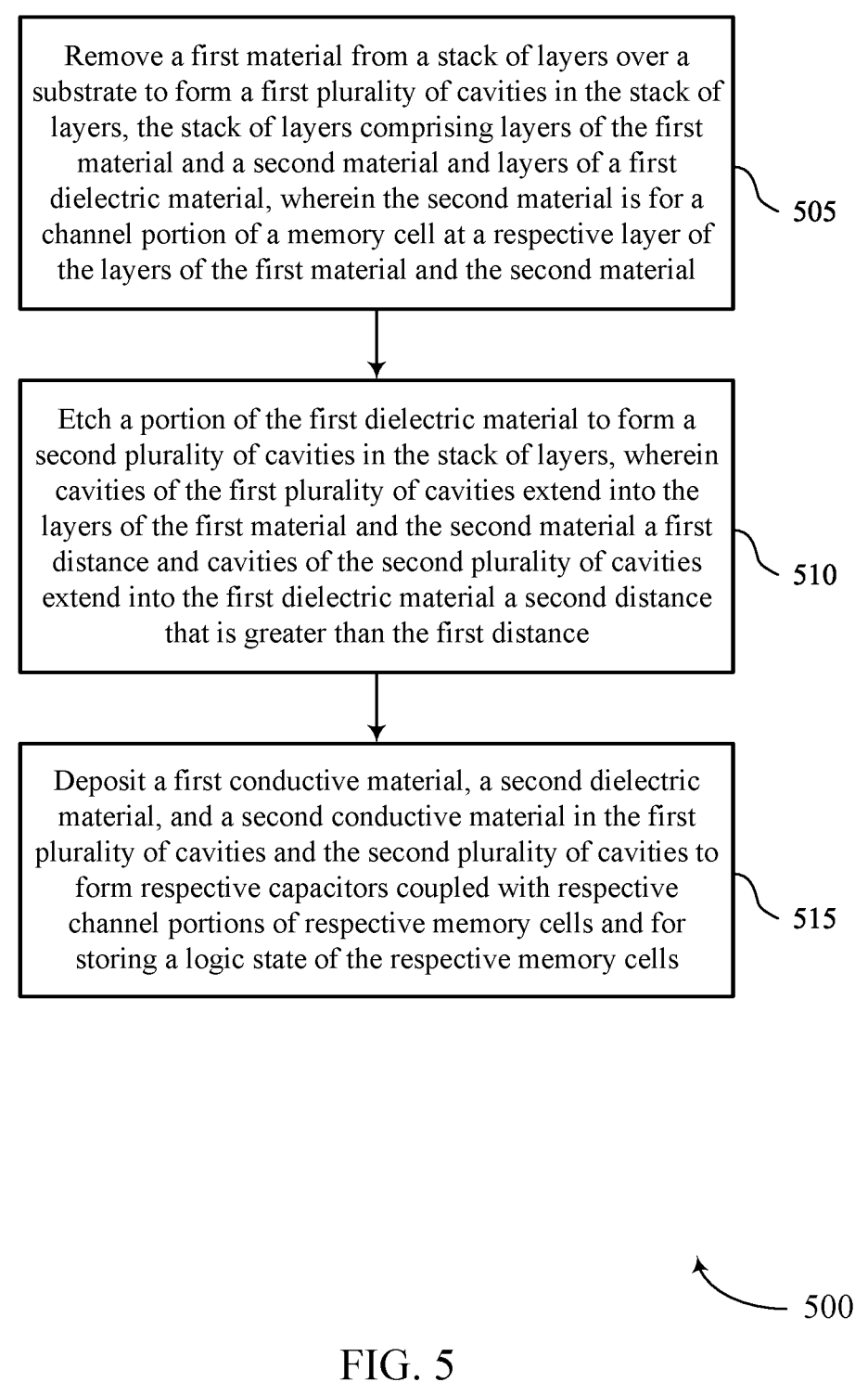

Remove a first material from a stack of layers over a substrate to form a first plurality of cavities in the stack of layers, the stack of layers comprising layers of the first material and a second material and layers of a first dielectric material, wherein the second material is for a channel portion of a memory cell at a respective layer of the layers of the first material and the second material

505

Etch a portion of the first dielectric material to form a second plurality of cavities in the stack of layers, wherein cavities of the first plurality of cavities extend into the layers of the first material and the second material a first distance and cavities of the second plurality of cavities extend into the first dielectric material a second distance that is greater than the first distance

510

Deposit a first conductive material, a second dielectric material, and a second conductive material in the first plurality of cavities and the second plurality of cavities to form respective capacitors coupled with respective channel portions of respective memory cells and for storing a logic state of the respective memory cells

MEMORY CELL CAPACITOR STRUCTURES FOR THREE-DIMENSIONAL MEMORY ARRAYS

FIELD OF TECHNOLOGY

The following relates to one or more systems for memory, including memory cell capacitor structures for three-dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not- or (NOR) and not- and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIG. 5 shows a flowchart illustrating a method or methods that support memory cell capacitor structures for three-dimensional memory arrays in accordance with examples as disclosed herein.

DETAILED DESCRIPTION

Figure 1:
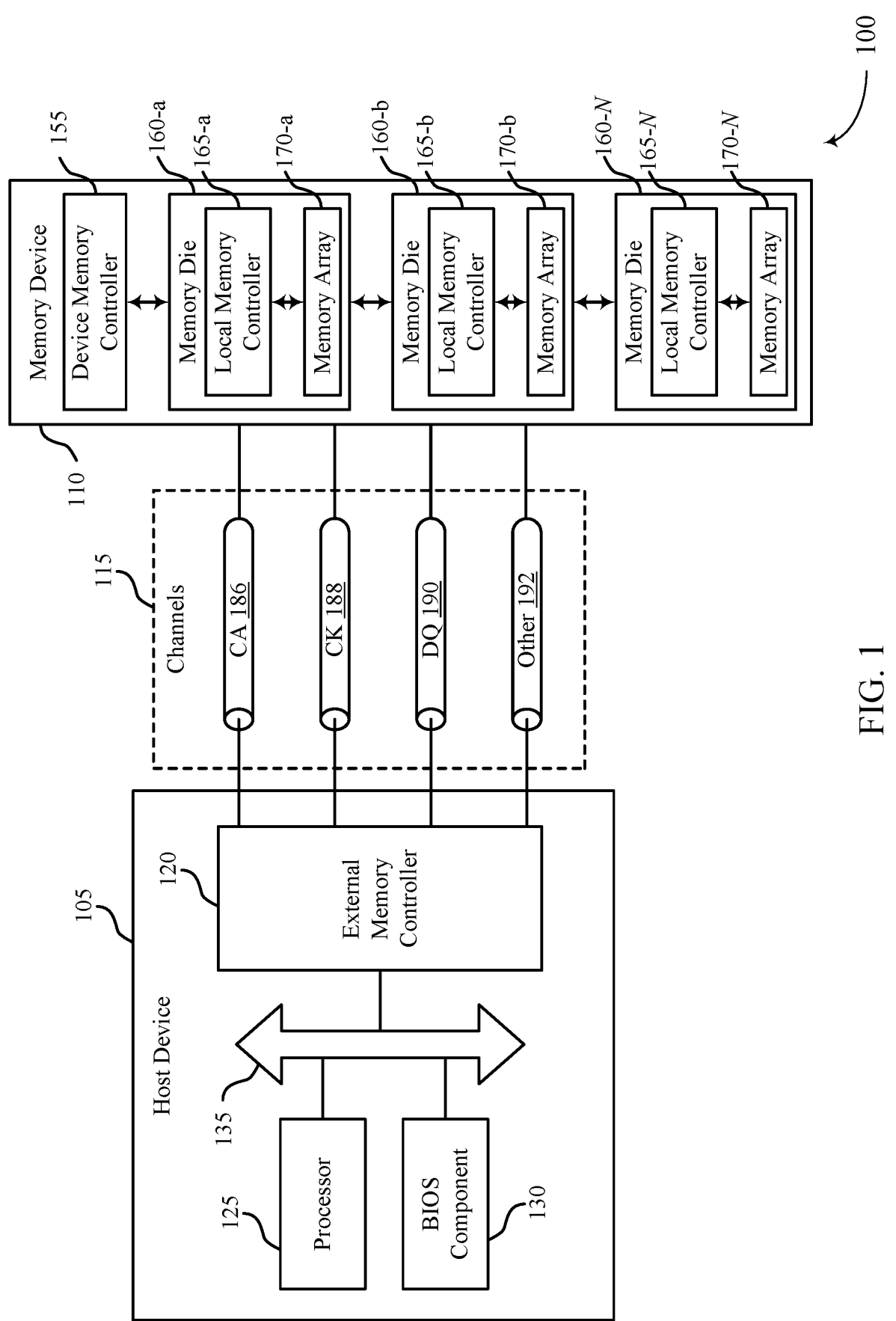
FIG. 1 illustrates an example of a system that supports memory cell capacitor structures for three-dimensional memory arrays in accordance with examples as disclosed herein.

Memory devices may include one or more arrays of memory cells and supporting circuitry formed over a substrate for operating and accessing the memory cells. For example, a memory device may include one or more memory arrays that have multiple levels of memory cells, where a level may refer to a plane above and parallel to the substrate (e.g., in a horizontal direction). In some examples, a memory cell of a memory array may include a capacitor that is operable to store the logic state of the memory cell. The memory cell may also include a channel portion (e.g., a switching component, a cell selection component, one or more transistors) that is operable to couple the capacitor with a digit line such that the logic state may be written or read (among other operations). Scaling the memory cell to reduce its size may support increased cell density within the memory device, thereby increasing a storage capacity of the memory device relative to its size, among other benefits. In some cases, however, scaling the memory cell may include reducing one or more dimensions of the capacitor such that the capacitor is unable to properly store and maintain the logic state of the memory cell. For example, a capacitance of the capacitor may be reduced based on the dimensional scaling such that the capacitance is insufficient to adequately support proper operation of the memory cell. As a result, memory cell scaling, and thus memory device scaling, may be limited in some different examples.

In accordance with the examples described herein, a memory device may include memory cells having capacitors that support memory cell scaling while supporting operable capacitance for proper memory cell function (e.g., logic state storage). For example, a memory cell at a first level of a memory array may include a channel portion and a capacitor for storing a logic state of the memory cell. A first portion of the capacitor may be located, for example, between the channel portion and a voltage source coupled with the memory cell. A second portion of the capacitor may be in a cavity in, for example, a dielectric layer between, for example, the first level and a second level of the memory array. For example, the second portion of the capacitor may extend into the dielectric layer, and the second portion of the capacitor may be located between the channel portion and a word line coupled with a channel portion of a second memory cell at the second level.

By having the second portion of the capacitor extend into the dielectric layer, the memory cell may be scaled while supporting proper memory cell function. For example, a length of the first portion of the capacitor in a first direction, for example, that is parallel to a substrate over which the memory array is located may be reduced (e.g., from approximately 300 nanometers (nm) to approximately 100 nm, based on some other reduction in length), which may decrease a memory cell pitch in the first direction, among other benefits. The second portion of the capacitor may compensate for a reduction in capacitance of the capacitor associated in reducing the length of the first portion of the capacitor in the first direction. For example, by forming the second portion of the capacitor in the cavity in the dielectric layer (e.g., instead of between the channel portion and the voltage source), the length of the capacitor between channel portion and the voltage source may be reduced while still having sufficient capacitance to support proper memory cell function. Therefore, the memory cell may be better scaled, thereby increasing a memory cell density of the memory device, among other benefits.

Features of the disclosure are initially described in the context of systems and dies as described with reference to FIGS. 1 and 2. Features of the disclosure are described in the context of manufacturing operations and a layout with reference to FIGS. 3A-3C and 4. These and other features of the disclosure are further illustrated by and described with reference to a flowchart that relates to memory cell capacitor structures for three-dimensional memory arrays as described with reference to FIG. 5.

FIG. 1 illustrates an example of a system 100 that supports memory cell capacitor structures for three-dimensional memory arrays in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general-purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory die 160 may be an example of a two-dimensional array of memory cells or may be an example of a three-dimensional array of memory cells. In some examples, a two-dimensional memory die 160 may include a single memory array 170. In some examples, a three-dimensional memory die 160 may include two or more memory arrays 170, which may be stacked on top of one another or positioned next to one another (e.g., relative to a substrate). In some examples, memory arrays 170 in a three-dimensional memory die 160 may be referred to as or otherwise include different sets (e.g., decks, levels, layers, dies). A three-dimensional memory die 160 may include any quantity of stacked memory arrays 170 (e.g., two high, three high, four high, five high, six high, seven high, eight high). In some three-dimensional memory dies 160, different levels may share a common access line such that some levels may share one or more of a word line, a digit line, or a plate line.

In accordance with examples described herein, a memory cell included in a three-dimensional memory die 160 may include a capacitor structure that supports memory cell scaling while supporting proper storage of a logic state by the memory cell. For example, the three-dimensional memory die 160 may include respective dielectric layers located between levels of stacked memory arrays 170. To support memory cell scaling and logic state storage, a memory cell at a first level may include a capacitor having a portion that extends into a dielectric layer between the first level and a second level. For example, the capacitor of the memory cell may include a first portion that is located at the first level between a channel portion (e.g., a switching component, one or more transistors) of the memory cell and voltage source, such as a plate line coupled with the memory cell. The capacitor may also include a second portion that is located in a cavity in the dielectric layer between the first level and the second level. Such a capacitor structure of a memory cell may enable memory cell pitch reduction at least in a first direction, for example, that is parallel to a substrate of the three-dimensional memory die 160. As a result, an increased density of memory cells in the three-dimensional memory die 160 may be supported, thereby increasing a storage capacity of the three-dimensional memory die 160, among other benefits.

Figure 2:
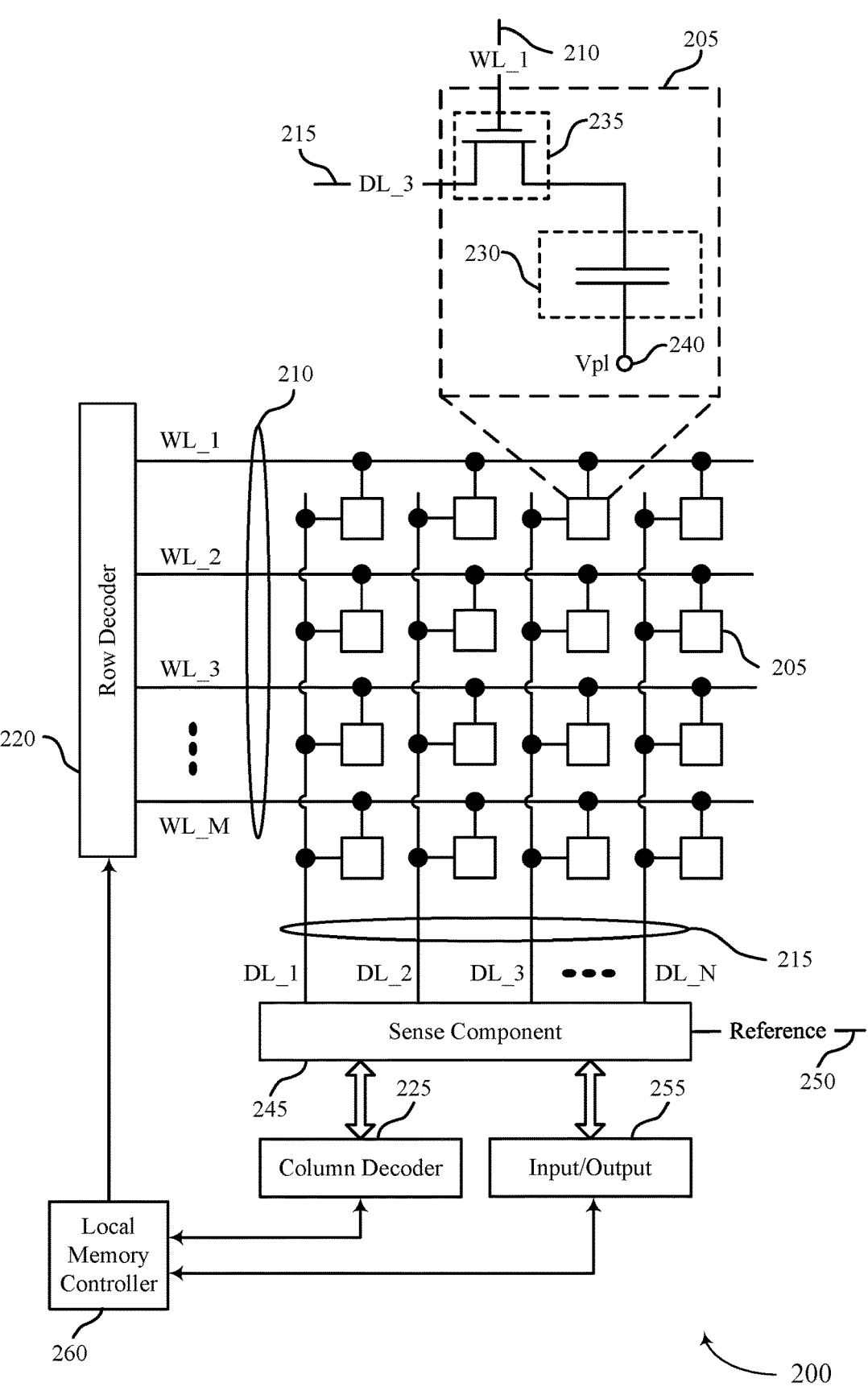
FIG. 2 illustrates an example of a memory die that supports memory cell capacitor structures for three-dimensional memory arrays in accordance with examples as disclosed herein.

FIG. 2 illustrates an example of a memory die 200 that supports memory cell capacitor structures for three-dimensional memory arrays in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210 and digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that couples the memory cell 205 with a sense component 245. In some architectures, the memory cell 205 may be selectively coupled with the digit line 215 during portions of an access operation. For example, the word line 210 and the switching component 235 of the memory cell 205 may be operable to couple or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

In some examples, the memory die 200 may be an example of a three-dimensional memory die that includes multiple arrays of memory cells 205 that are stacked according to levels relative to a substrate. In some examples, a respective dielectric layer may be located between each level to separate the respective levels from each other. To support scaling of the memory cells 205 while supporting the storage of logic states by the memory cells 205, a memory cell 205 may include a capacitor 230 having a portion that extends into a dielectric layer between two levels. For example, a capacitor 230 of a memory cell 205 at a first level may include a first portion that is located at the first level between a switching component 235 of the memory cell 205 and the voltage source 240. The capacitor 230 may also include a second portion that is located in a cavity in a dielectric layer between the first level and a second level. In some examples, the second portion may extend into the dielectric layer such that the second portion is located between the switching component 235 and a word line 210 coupled with a switching component 235 of a memory cell 205 at the second level. Such a capacitor structure of a memory cell 205 may enable memory cell pitch reduction at least in a first direction that is parallel to a substrate of the memory die 200. As a result, an increased density of memory cells 205 in the memory die 200 may be supported, thereby increasing a storage capacity of the memory die 200, among other benefits.

Figure 3A:
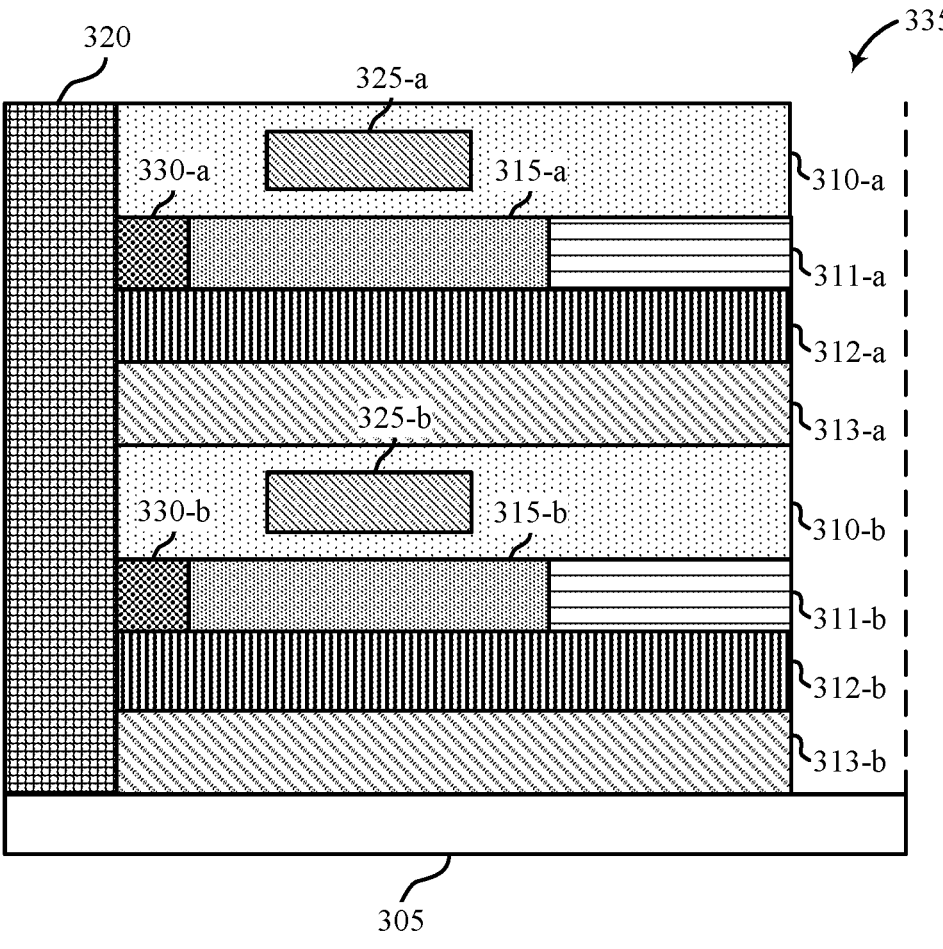
FIGS. 3A, 3B, and 3C illustrate examples of operations of a manufacturing process that supports memory cell capacitor structures for three-dimensional memory arrays in accordance with examples as disclosed herein.
Figure 3B:
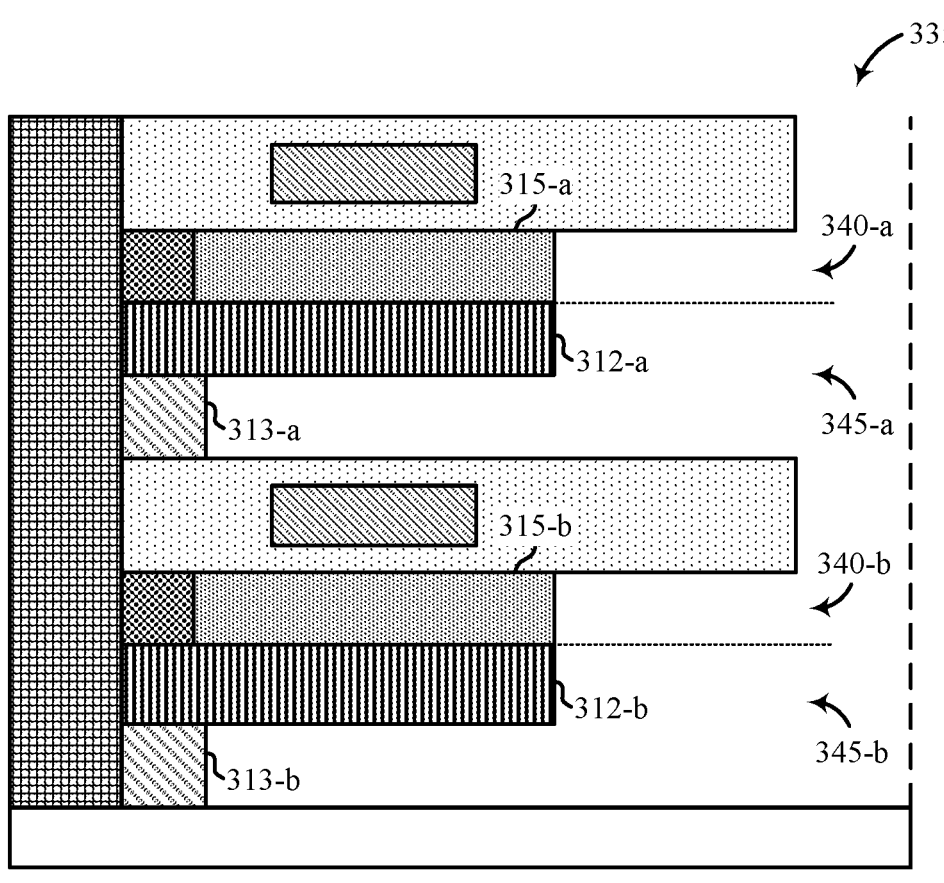
Figure 3C:
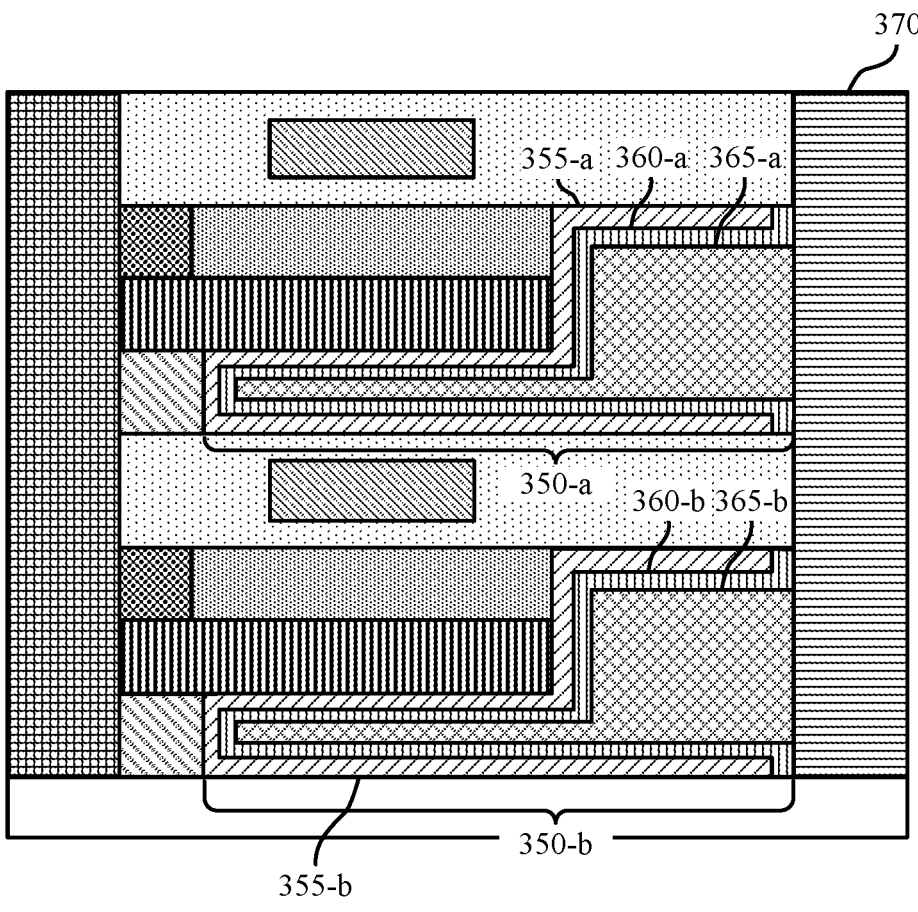

FIGS. 3A through 3C illustrate examples of operations that support memory cell capacitor structures for three-dimensional memory arrays in accordance with examples as disclosed herein. For example, FIGS. 3A through 3C may illustrate aspects of a sequence of manufacturing operations for fabricating aspects of a layout 300, which may be a portion of a memory device (e.g., a portion of a memory device 110, a portion of a memory die 200). Each view of the FIGS. 3A through 3C may be described with reference to an x-direction, a y-direction, and a z-direction, as illustrated. The manufacturing operations illustrate various cross-sectional views of the layout 300. For example, the manufacturing operations illustrate cross-sectional views of the layout 300 in an xz-plane through the layout 300. Although the layout 300 illustrates examples of certain relative dimensions and quantities of various features, aspects of the layout 300 may be implemented with other relative dimensions or quantities of such features in accordance with examples as disclosed herein.

Operations illustrated in and described with reference to FIGS. 3A through 3C may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

FIG. 3A illustrates a portion of a layout 300-a after a first set of one or more manufacturing operations. The first set of manufacturing operations may include forming various structures and materials over a substrate 305. The substrate 305 may be a semiconductor wafer or other substrate over which a stack of layers is formed (e.g., deposited). The stack of layers may include layers of a dielectric materials and layers of a material 311 and a channel material 315. For example, the stack of layers may include layers of a dielectric material 310, a dielectric material 312, and a dielectric material 313. In some examples, the layers of dielectric materials 312 and 313 may be layers of a single dielectric material. In some examples, the layers of the dielectric materials 312 and 313 may constitute sublayers of a dielectric layer that includes the dielectric materials 312 and 313. In some examples, the layers of the material 311 and the channel material 315 may be formed such that the layers of the material 311 and the channel material 315 are located between layers of dielectric material 310 and layers of dielectric material 312. The stack of layers may include multiple layer sets, where a layer set may include a layer of the dielectric material 310, a layer of the material 311 and the channel material 315, a layer of the dielectric material 312, and a layer of the dielectric material 313.

In the example of the layout 300-a, the stack of layers may include: a first layer set including a dielectric material 310-a, a material 311-a, a channel material 315-a, a dielectric layer 312-a, and a dielectric layer 313-a; and a second layer set including a dielectric material 310-b, a material 311-b, a channel material 315-b, a dielectric material 312-b, and a dielectric material 313-b over the substrate. Although the stack of layers is illustrated with two layer sets, a stack of layers in accordance with examples as disclosed herein may include any quantity of layer sets (e.g., tens of layer sets, hundreds of layers, and so on).

In some examples, the first set of manufacturing operations may include removing (e.g., etching) sacrificial layers (e.g., a nitride material) between the dielectric material 310 and the dielectric material 312 and forming (e.g., depositing) the channel material 315 in voids formed based on removing the sacrificial layers. For example, the material 311 may be an example of a sacrificial material, and the first set of manufacturing operations may include etching a portion of the material 311 and forming the channel material 315 in cavities formed based on etching the portion of the material 311. In some examples, the first set of manufacturing operations may include etching a cavity 335 through the stack of layers. In some cases, the formation of the channel material 315 at the respective layers of the stack of layers may be based on etching the cavity 335. For example, the channel material 315-a and the channel material 315-b may be deposited using the cavity 335.

The channel material 315 may be for a channel portion of a memory cell to be formed at the layers of channel material 315. In some examples, the channel material 315 may include one or more materials used to form a cell selection component (e.g., a switching component 235) of a memory cell. The dielectric materials may provide electrical isolation between levels of a memory array to be formed. For example, the layers of the channel material 315 may correspond to respective levels of the memory array.

The first set of manufacturing operations may also include operations that support forming a digit line 320 and digit line extensions 330 for coupling the digit line 320 with respective channel material 315. For example, the first set of manufacturing operations may include etching a cavity through the stack of layers and depositing one or more conductive materials to form the digit line 320 and the digit line extensions 330. For example, a digit line extension 330-a may be formed from a conductive material to couple with the channel material 315-a, and a digit line extension 330-b may be formed from the conductive material to couple with the channel material 315-b. The digit line 320 may extend through the stack of layers in a direction orthogonal to the substrate 305 (e.g., along the z-direction) and may couple with respective channel materials 315 using respective digit line extensions 330. In some examples, the formation of the channel material 315 at the respective layers of the stack of layers may be based on etching the cavity for forming the digit line 320 and the digit line extensions 330. For example, the channel material 315-a and the channel material 315-b may be deposited using the cavity for forming the digit lines 320 and the digit lines extensions 330.

The first set of manufacturing operations may also include operations that support forming word lines 325. For example, the first set of manufacturing operations may include the deposition of a conductive material to form a word line 325-a that is coupled with the channel material 315-a and a word line 325-b that is coupled with the channel material 315-b. The word lines 325 may extend in a direction that is parallel to the substrate and along the y-direction. For example, the word line 325-a may extend along the y-direction and couple with respective channel materials 315 formed along the y-direction and at a level of the channel material 315-a. The word lines 325 may be formed at (e.g., within) layers of the dielectric material 310.

Although the structures and materials are illustrated as being deposited in direct contact with the substrate 305, in some other examples, the layout 300-a may include other materials or components between the structures and materials and the substrate 305, such as interconnection or routing circuitry (e.g., access lines), control circuitry (e.g., transistors, aspects of a local memory controller, decoders, multiplexers), or other structures and materials (e.g., other structures and materials that have been processed in accordance with examples as disclosed herein), which may include various conductor, semiconductor, or dielectric materials between the structures and materials and the substrate 305. For example, the layout 300-a may include a layer including thin-film-transistors (TFTs) between the substrate 305 and the structures and materials, among others. In some examples, the substrate 305 itself may include such interconnection or routing circuitry.

FIG. 3B illustrates a portion of a layout 300-b after a second set of one or more manufacturing operations. The second set of manufacturing operations may include further operations (e.g., recess etch operations) that support forming capacitors for memory cells in accordance with examples as disclosed herein. For example, the second set of manufacturing operations may include removing (e.g., etching) the material 311 at each layer of the material 311 and the channel material 315 to form a set of cavities 340 in the stack of layers. For instance, the second set of manufacturing operations may include a first etch of the material 311-a to form a cavity 340-a and the material 311-b to form a cavity 340-b.

The second set of manufacturing operations may also include removing (e.g., etching) a portion of the dielectric materials 312 and 313 to form a set of cavities 345. For example, the second set of manufacturing operations may include a second etch of a portion of the dielectric material 312-a and a portion of the dielectric material 312-b and a third etch of a portion of the dielectric material 313-a and a portion of the dielectric material 313-b. The second etch and the third etch may form a cavity 345-a where the portions of the dielectric materials 312-a and 313-a are removed and a cavity 345-b where the portions of the dielectric materials 312-b and 313-b are removed.

The cavities 340 may extend into the layers of the material 311 and the channel materials 315 (e.g., and into the dielectric materials 312) a first distance a (e.g., from the cavity 335), and the cavities 345 may extend into the dielectric material 313 a second distance (e.g., from the cavity 335). The first distance and the second distance may be a distance along the x-direction (e.g., a distance parallel to the substrate 305 along the x-direction). The second distance may be greater than the first distance. That is, the cavities 345 may extend further into the dielectric materials 313 than the cavities 340 extend into the layers of the material 311 and the channel material 315. In other words, a portion of the dielectric materials 313 removed along the x-direction may be greater than the material 311 along the x-direction. In some examples, the second distance may be greater than the first distance based on a first duration of the first etch being less than a second duration of the third etch. For example, the second set of manufacturing operations may include performing the first etch of the material 311 for the first duration and performing the third etch of the dielectric material 313 for the second duration. Based on performing the third etch for a longer duration of time than the first etch, the second distance may be greater than the first distance.

In some examples, the second distance may be greater than the first distance based on operations for performing the first etch. For example, the second set of manufacturing operations may include an implant operation in which the material 311 is implanted with one or more materials to form a new material. The first etch of the material 311-a and the material 311-b may include etching the new material to form the cavity 340-a and the cavity 340-b. The first etch may be an etch that etches the new material while leaving the channel material 315. The material 311 may be implanted such that the new material extends the first distance. Accordingly, the second distance may be greater than the first distance based on the implantation of the material 311 for the first distance.

In some examples, the cavities 345 may extend into the dielectric materials 310 such that the cavities 345 are located between a channel material 315 at a first layer and a word line 325 at a second layer. For example, the cavity 345-*a* may extend into the dielectric material 313-*a* such that the cavity 345-*a* is between the channel material 315-*a* and the word line 325-*b*.

FIG. 3C illustrates a portion of a layout 300-*c* after a third set of one or more manufacturing operations. The third set of manufacturing operations may include further operations (e.g., deposition operations) that support forming capacitors for memory cells in accordance with examples as disclosed herein. For example, the third set of manufacturing operations may include the formation (e.g., deposition) of a conductive material 355, a dielectric material 360, and a conductive material 365 in the cavities 340 and the cavities 345. The formation of the conductive material 355, the dielectric material 360, and the conductive material 365 may form respective capacitors 350 coupled with respective channel portions of respective memory cells.

For instance, the third set of manufacturing operations may include depositing a conductive material 355-*a* in the cavity 340-*a* and the cavity 345-*a* and a conductive material 355-*b* in the cavity 340-*b* and the cavity 345-*b* (e.g., as part of a same deposition procedure). The conductive material 355-*a* may form a first conductive plate of a capacitor 350-*a*, and the conductive material 355-*b* may form a first conductive plate of a capacitor 350-*b*. In some examples, the conductive material 355-*a* may be in contact with the channel material 315-*a*, and the conductive material 355-*b* may be in contact with the channel material 315-*b*. In some examples, the conductive materials 355 may be separated from the respective channel materials 315 by an intermediate material (not shown).

The third set of manufacturing operations may include depositing a dielectric material 360-*a* in the cavity 340-*a* and the cavity 345-*a* and a dielectric material 360-*b* in the cavity 340-*b* and the cavity 345-*b* (e.g., as part of a same deposition procedure). For example, the deposition of the conductive material 355 may not fill an entirety of the cavities 340 and the cavities 345, and the dielectric material 360 may be deposited in a portion of the cavities 340 and the cavities 345 that remain after the deposition of the conductive material 355. The dielectric material 360-*a* may form a dielectric between conductive plates of the capacitor 350-*a*, and the dielectric material 360-*b* may form a dielectric between conductive plates of the capacitor 350-*b*. In some examples, the dielectric materials 360 may be in contact with the conductive materials 355.

The third set of manufacturing operations may include depositing a conductive material 365-*a* in the cavity 340-*a* and the cavity 345-*a* and a conductive material 365-*b* in the cavity 340-*b* and the cavity 345-*b* (e.g., as part of a same deposition procedure). For example, the deposition of the dielectric material 360 may not fill a remainder of the cavities 340 and the cavities 345, and the conductive material 365 may be deposited in a portion of the cavities 340 and the cavities 345 that remain after the deposition of the dielectric material 360 (e.g., the remainder of the cavities 340 and the cavities 345). Accordingly, each of the conductive materials 355, the dielectric materials 360, and the conductive materials 365 may extend into the cavities 340 and the cavities 345. Additionally, the conductive materials 355, the dielectric materials 360, and the conductive materials 365 may extend farther into the cavities 345 than into the cavities 340 based on the second distance being greater than the first distance. The conductive material 365-*a* may form a second conductive plate of the capacitor 350-*a*, and the conductive material 365-*b* may form a second conductive plate of the capacitor 350-*b*. In some examples, the conductive materials 365 may be in contact with the dielectric materials 360. The conductive material 355, the dielectric material 360, and the conductive material 365 may be deposited in the cavities 340 and the cavities 345 such that the conductive material 355 is isolated (e.g., physically, electrically) from the conductive material 365. That is, the dielectric material 360 may separate the conductive material 355 from the conductive material 365. In some examples, the conductive material 355 and the conductive material 365 may be a same conductive material. In some examples, the conductive material 355 and the conductive material 365 may be different conductive materials.

The third set of manufacturing operations may also include depositing a conductive material 370 in the cavity 335. The conductive material 370 may form a cell plate (e.g., a plate line) for coupling the capacitors 350 with a voltage source, such as voltage source 240 described with reference to FIG. 2 (e.g., a cell plate reference voltage, such as Vpl, a ground voltage source, such as Vss). In some examples, the conductive material 365 and the conductive material 370 may be a same conductive material. In some examples, the conductive material 365 and the conductive material 370 may be different conductive materials.

The capacitor 350-*a* may be operable to store a logic state of a first memory cell that includes the channel material 315-*a* and the capacitor 350-*a*, and the capacitor 350-*b* may be operable to store a logic state of a second memory cell that includes the channel material 315-*b* and the capacitor 350-*b*. The first memory cell may be a memory cell at a first level of a memory array formed in accordance with the manufacturing operations, and the second memory cell may be a memory cell at a second level of the memory array. For example, additional memory cells may be formed along the x-direction and the y-direction (e.g., in an xy-plane) in accordance with the manufacturing operations to form respective levels of memory cells of a memory array.

Based on forming the memory cells in accordance with the manufacturing operations, a cell density of the memory array may be increased. For example, the capacitors 350 may include a first portion that is located between the channel material 315 and the conductive material 370 (e.g., the cell plate). The capacitors 350 may also include a second portion that is located in the cavities 345. That is, the second portion of the capacitors 350 may extend into the dielectric material 310 such that the capacitors 350 are located at both a level of the memory array and within a dielectric layer between respective levels of the memory array. By forming the second portion of the capacitors 350 in the dielectric material 310, a length of the first portion of the capacitors 350 may be reduced such that a memory cell pitch in the x-direction may be reduced. For example, a reduction in length of the first portion of the capacitors 350 along the x-direction may be associated with a reduction in capacitance of the capacitors 350. Forming the second portion of the capacitors 350 in the dielectric material 310 may compensate for the reduction in capacitance, for example, by increasing a size of the capacitors 350 to increase the capacitance of the capacitors 350. As a result, the length of the first portion of the capacitors 350 along the x-direction may be reduced while supporting logic state storage. This may reduce the memory cell pitch (e.g., and the word line 325 pitch) along the x-direction, thereby increasing a cell density of the memory array, among other benefits.

Figure 4:
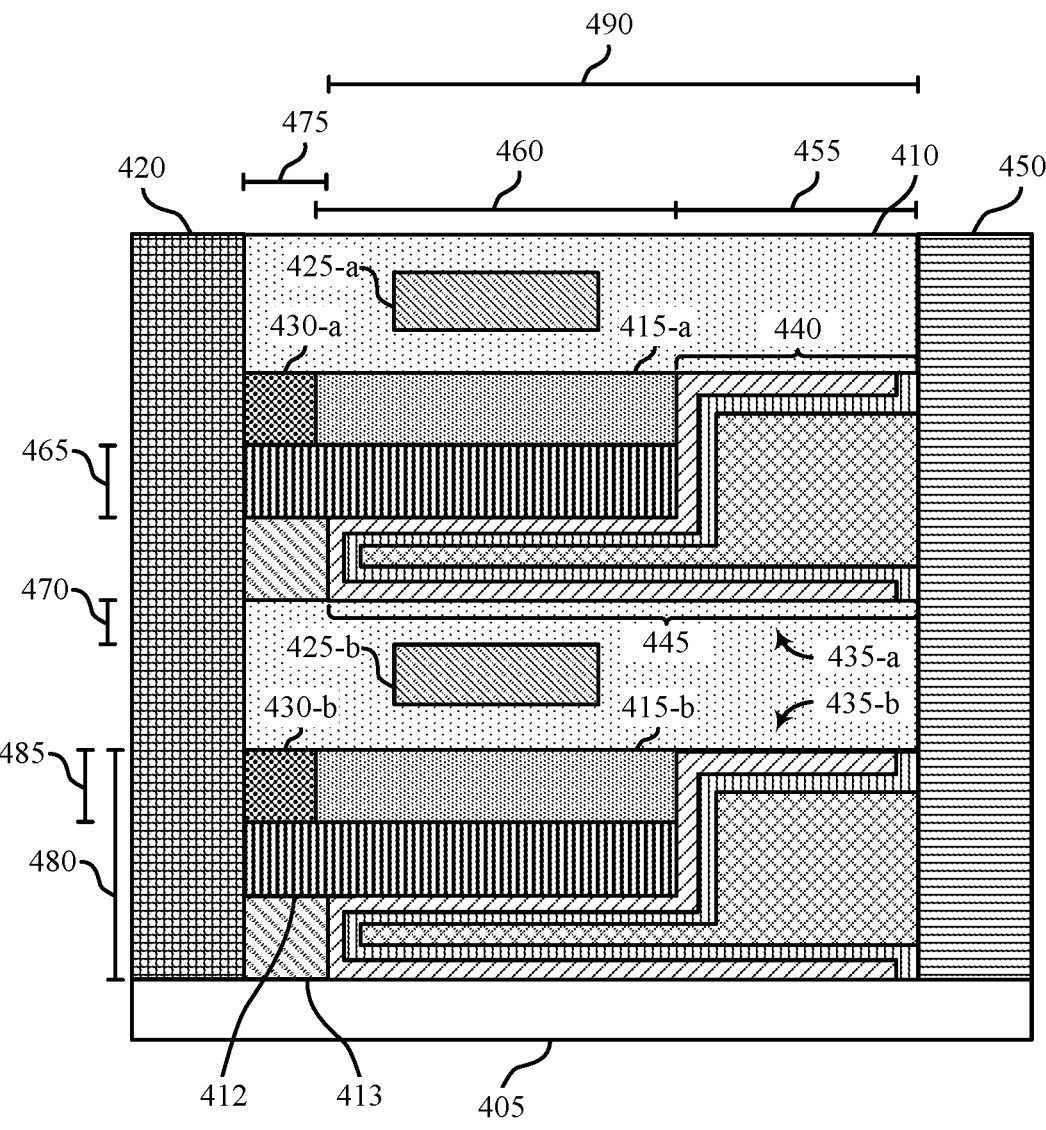
FIG. 4 illustrates an example of a layout that supports memory cell capacitor structures for three-dimensional memory arrays in accordance with examples as disclosed herein.
Figure 4:

FIG. 4 illustrates an example of a layout 400 that supports memory cell capacitor structures for three-dimensional memory arrays in accordance with examples as disclosed herein. The layout 400 may be an example for implementing aspects of a layout 300 described with reference to FIGS. 3A through 3C. For example, the layout 400 may be an example of a portion of a memory device formed in accordance with the manufacturing operations described with reference to FIGS. 3A through 3C. Aspects of the layout 400 may be described with reference to an x-direction (e.g., a row direction), a y-direction (e.g., a column direction), and a z-direction (e.g., a level direction).

The layout 400 includes an example architecture that may support capacitor structures for memory cells (e.g., memory cells 205) within a three-dimensional memory array. The layout 400 illustrates a cross-sectional view of the layout 400 in an xz-plane of the layout 400.

The layout 400 may include a substrate 405, which may be an example of a substrate 305 as described with reference to FIG. 3A. The layout 400 may also include dielectric layers 410, 412, and 413, which may be examples of the dielectric materials 310, 312, and 313 described with reference to FIGS. 3A through 3C, respectively. For example, the dielectric layers 410, 412, 413 may be located between and separate (e.g., physically, electrically) levels of a memory array along the z-direction. The levels of the memory array may each include respective memory cells that include a respective channel portion 415 and a capacitor 435. For example, the layout 400 includes a first memory cell at a first level of the memory array and a second memory cell at a second level of the memory array. The first memory cell may include a channel portion 415-a coupled with a capacitor 435-a, and the second memory cell may include a channel portion 415-b coupled with a capacitor 435-b. The channel portions 415 may be formed from channel materials 315, and the capacitors 435 may be formed from conductive materials 355, dielectric materials 360, and conductive materials 365 as described with reference to FIGS. 3A through 3C, respectively. The capacitors 435 may be examples of a capacitor 350 described with reference to FIG. 3C.

The layout 400 may include access circuitry to support accessing the memory cells. For example, the layout 400 may include a digit line 420, which may be an example of a digit line 215 or a digit line 320 described with reference to FIGS. 2 through 3C. The digit line 420 may extend through the levels of the memory array along the z-direction and may be coupled with a memory cell at each level. For example, the digit line 420 may be coupled with the channel portion 415-a of the first memory cell using a digit line extension 430-a and may be coupled with the channel portion 415-b of the second memory cell using a digit line extension 430-b. The digit line extensions 430 may be examples of a digit line extension 330 described with reference to FIG. 3A.

The layout 400 may also include words lines 425, which may be examples of a word line 210 or a word line 325 described with reference to FIGS. 2 through 3C. The layout 400 may include a word line 425 at each level of the memory array (e.g., formed within a layer of the dielectric material 410) that couple with one or more memory cells of the memory array at a respective level along the y-direction. For example, the layout 400 may include a word line 425-a that is coupled with the channel portion 415-a of the first memory cell and a word line 425-b that is coupled with the channel portion 415-b of the second memory cell.

The layout 400 may also include a cell plate 450, which may be an example of a plate line described with reference to FIG. 2 or may be formed from a conductive material 370 described with reference to FIG. 3C. The cell plate 450 may extend through the levels of the memory array along the z-direction and may be coupled with a memory cell at each level. For example, the cell plate 450 may be coupled with the capacitor 435-a of the first memory cell and may be coupled with the capacitor 435-b of the second memory cell. The cell plate 450 may be or be coupled with a voltage source, such as a voltage source 240 described with reference to FIG. 2. In some examples, the voltage source may be a ground voltage source that is configured to ground a terminal or conductive plate of the capacitors 435 (e.g., bias the terminal to a ground voltage). In some examples, the voltage source may bias the terminal of the capacitors 435 to some other voltage, such as Vpl.

The layout 400 may support accessing the memory cells based on voltages applied to access circuitry. For example, a logic state may be written to or read from the capacitor 435-a of the first memory cell based on respective voltages applied to the digit line 420, the word line 425-a, the cell plate 450, or a combination thereof (e.g., as described with reference to FIG. 2).

A capacitor 435 may include a portion 440 that is located between a channel portion 415 and the cell plate 450 and a portion 445 that extends into a layer of dielectric material 412 and a layer of dielectric material 413. For example, the capacitor 435-a may include a portion 440 that is located at the first level of the memory array and between the channel portion 415-a and the cell plate 450. The capacitor 435-a may also include a portion 445 that extends into the dielectric material 412 and the dielectric material 413 located between the first level and the second level. The portion 445 may extend into the dielectric materials 412 and 413 in a first direction that is parallel to the substrate 405 and along the x-direction and may extend into the dielectric materials 412 and 413 in a second direction that is orthogonal to the substrate 405 (e.g., along the z-direction). The portion 440 may be located in a cavity 340, and the portion 445 may be located in a cavity 345 described with reference to FIGS. 3B and 3C.

By including the portion 440 and the portion 445, the cross-sectional shape of the capacitor 435-a may be a staircase-like structure including a first step corresponding to the portion 445 that extends into the dielectric material 413 and a second step corresponding to the portion 440 and the portion 445 that extends into the dielectric material 412. It is noted that the cross-sectional shape of the capacitor 435 (e.g., and the other structures of the layout 400) is depicted as an example cross-sectional shape for clarity. For example, first step and the second step of the staircase are depicted as rectangular in shape, however, the capacitor 435-a may be formed such that the first step and the second shape are non-uniform, have rounded edges, are oval-shaped, or are hill-shaped, among other cross-sectional shapes.

The portion 445 may be located between the channel portion 415-a and the word line 425-b. For example, the portion 445 may extend into the dielectric material 413 along the x-direction such that portion 445 is located between the channel portion 415-a and the word line 425-b. Based on the portion 445 being located between the channel portion 415-a and the word line 425-b, the capacitor 435-a may be operable to shield the channel portion 415-a from a disturbance caused by the word line 425-b. For example, biasing the word line 425-b to a voltage may cause a disturbance to the channel portion 415-a. That is, there may exist a relatively weak coupling (e.g., capacitive coupling) between the word line 425-*b* and the channel portion 415-*a* such that a voltage applied to the word line 425-*b* may disturb the channel portion 415-*a* (e.g., cause a portion of the voltage applied to the word line 425-*b* to be applied to channel portion 415-*a*). Such disturbance may increase noise experienced by the channel portion 415-*a*, which may adversely affect (e.g., decrease an accuracy of) access operations performed on the first memory cell.

The capacitor 435-*a* may function as a shield (e.g., a ground shielding) between the channel portion 415-*a* and the word line 425-*b* to reduce the disturbance based on the portion 445. For example, the capacitance of the capacitor 435-*a* may be greater than the weak capacitive coupling between the word line 425-*b* and the channel portion 415-*a*. In some examples, the cell plate 450 may be a ground voltage source that biases the capacitor 435-*a* (e.g., a terminal of the capacitor 435-*a*) to ground, which may enable the capacitor 435-*a* to block or absorb the disturbance based on the capacitance of the capacitor 435-*a* being greater than the weak capacitive coupling and the portion 445 being physically located between the word line 425-*b* and the channel portion 415-*a*.

The memory cells may be scaled based at least in part on the capacitors 435 including the portion 440 and the portion 445. For example, by including the portion 445, a length 455 of the portion 440 of the capacitor 435-*a* may be reduced. For instance, the length 455 may correspond to a length of the portion 440 along the x-direction. Reducing the length 455 may be associated with reducing a capacitance of the capacitor 435-*a*. By including (e.g., forming) the portion 445 in the dielectric materials 412 and 413, the capacitance of the capacitor 435-*a* may be increased such that the reduction in capacitance associated with reducing the length 455 may be compensated. As a result, a memory cell pitch and pitch of word lines 425 may be reduced, which may increase cell density and storage capacity.

In some examples, the length 455 of the portion 440 may be reduced such that it is less than a length 460 of the channel portion 415-*a* along the x-direction. For example, the length 460 of the channel portion 415-*a* may be approximately 180 nm (e.g., or some other nm length), and the length 455 of the portion 440 may be approximately 100 nm (e.g., or some other nm length less than the length 460). In some examples, a length 490 of the portion 445 along the x-direction may be greater than the length 460, for example, based on extending from the cell plate 450 to be between the channel portion 415-*a* and the word line 425-*b*. Based on reducing the length 455, an overall length of the memory cell along the x-direction may be reduced, thereby reducing memory cell pitch.

In some examples, the portion 445 may be separated from the channel portion 415-*a*, the word line 425-*b*, and the digit line 420 by respective portions of the dielectric materials 410, 412, and 413. For example, a portion of the dielectric material 412 may be located between the portion 445 and the channel portion 415-*a*. In some examples, the portion of the dielectric material 412 may be located between the portion 445 and the digit line extension 430-*a*. For example, the portion 445 may extend into the dielectric material 413 such that it extends beyond the channel portion 415-*a* along the x-direction towards the digit line 420 (e.g., the negative x-direction). Alternatively, the portion 445 may extend into the dielectric material 413 such that the channel portion 415-*a* extends beyond the portion 445 along the x-direction towards the digit line 420. A portion of the dielectric material 410 may be located between the portion 445 and the word line 425-*b*. A portion of the dielectric material 413 may be located between the portion 445 and the digit line 420.

A length 465 of the portion dielectric material 412 along the z-direction (e.g., a thickness of the dielectric material 412) and a length 470 of the portion of the dielectric material 410 along the z-direction (e.g., a thickness of the portion of the dielectric material 410) may be within a first nm range, such as range between a few nm (e.g., 2 nm, 3 nm, etc.) and tens of nanometers (e.g., 20 nm, 30 nm, etc.). In some examples, the length 465 and the length 470 may be a same nm length along the z-direction. In some examples, the length 465 and the length 470 may be different nm lengths along the z-direction that are within the first nm range. A length 475 of the portion of the dielectric material 413 along the x-direction (e.g., a width of the dielectric material 413) may be based on the extent to which the portion 445 extends into the dielectric material 413 along the x-direction. For example, the smaller the distance of a cavity of the dielectric material 413 (e.g., a cavity 345) in which the portion 445 is located, the greater the length 475.

In some examples, a height of a capacitor 435 may be greater than a height of the corresponding channel portion 415 based on extending into the dielectric materials 412 and 413. For example, a height 480 of the capacitor 435-*b* along the z-direction may correspond to a length of a portion 440 of the capacitor 435-*b* and a portion 445 of the capacitor 435-*b* along the z-direction. As a result, the height 480 of the capacitor 435-*b* may be greater than a height 485 of the channel portion 415-*b* (e.g., a length of the channel portion 415-*b* along the z-direction).

In some examples, a pitch of the word lines 425 along the z-direction may be reduced based on the portion 445 being operable to shield the channel portions 415 from disturbances caused by word lines 425, which may support further scaling of the layout 400. For example, thicker dielectric materials between a channel portion 415 at a first level and a word line 425 at a second level may reduce capacitive coupling between the channel portion 415 and the word line 425, thereby reducing disturbances caused by the word line 425. Accordingly, by including the portion 445 to shield the channel portion 415 from the word line 425, the length 465 of the portion of the dielectric material 412, the length 470 of the portion of the dielectric material 410, or both, may be reduced.

Thus, by forming memory cells that have a capacitor structure that extends into the dielectric layer between memory array levels, cell density may be increased, storage capacity may be increased, and word line to channel portion disturbances may be reduced.

FIG. 5 shows a flowchart illustrating a method or methods 500 that supports memory cell capacitor structures for three-dimensional memory arrays in accordance with examples as disclosed herein. The operations of method 500 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 505, the method may include removing a first material from a stack of layers over a substrate to form a first plurality of cavities in the stack of layers, the stack of layers including layers of the first material and a second material and layers of a first dielectric material, where the second material is for a channel portion of a memory cell at a respective layer of the layers of the first material and the second material. The operations of 505 may be performed in accordance with examples as disclosed herein.

At 510, the method may include etching a portion of the first dielectric material to form a second plurality of cavities in the stack of layers, where cavities of the first plurality of cavities extend into the layers of the first material and the second material a first distance and cavities of the second plurality of cavities extend into the first dielectric material a second distance that is greater than the first distance. The operations of 510 may be performed in accordance with examples as disclosed herein.

At 515, the method may include depositing a first conductive material, a second dielectric material, and a second conductive material in the first plurality of cavities and the second plurality of cavities to form respective capacitors coupled with respective channel portions of respective memory cells and for storing a logic state of the respective memory cells. The operations of 515 may be performed in accordance with examples as disclosed herein.

In some examples, an apparatus (e.g., a manufacturing system) as described herein may perform a method or methods, such as the method 500. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for removing a first material from a stack of layers over a substrate to form a first plurality of cavities in the stack of layers, the stack of layers including layers of the first material and a second material and layers of a first dielectric material, where the second material at is for a channel portion of a memory cell at a respective layer of the layers of the first material and the second material; etching a portion of the first dielectric material to form a second plurality of cavities in the stack of layers, where cavities of the first plurality of cavities extend into layers of the first material and the second material a first distance and cavities of the second plurality of cavities extend into the first dielectric material a second distance that is greater than the first distance; and depositing a first conductive material, a second dielectric material, and a second conductive material in the first plurality of cavities and the second plurality of cavities to form respective capacitors coupled with respective channel portions of respective memory cells and for storing a logic state of the respective memory cells. In some examples, the means for removing may include a controller-enabled manufacturing system or subsystem that can perform etching of the materials described in Aspect 1. In some examples, the means for removing may include one or more of an external memory controller (e.g., external memory controller 120), a device memory controller (e.g., device memory controller 155, another controller, one or more other devices for etching the recited materials using one or more etchant applicators, etchant maskers, etc). In some examples, the means for etching may include a controller-enabled manufacturing system or subsystem that can perform etching of the materials described in Aspect 1. In some examples, the means for etching may include one or more of an external memory controller (e.g., external memory controller 120), a device memory controller (e.g., device memory controller 155, another controller, one or more other devices for etching the recited materials using one or more etchant applicators, etchant maskers, etc). In some examples, the means for depositing may include a controller-enabled manufacturing system or subsystem that can perform deposition of the materials described in Aspect 1. In some examples, the means for deposition may include one or more of an external memory controller (e.g., external memory controller 120), a device memory controller (e.g., device memory controller 155, another controller, and/or one or more other devices for depositing the recited materials using one or more deposition applicators, deposition maskers, etc).

Aspect 2: The method or apparatus of aspect 1, where depositing the first conductive material, the second dielectric material, and the second conductive material to form the respective capacitors includes operations, features, circuitry, logic, means, or instructions, or any combination thereof for depositing the first conductive material in the first plurality of cavities and the second plurality of cavities, the first conductive material for a first conductive plate of the respective capacitors, where the first conductive material is in contact with the second material and the first dielectric material; depositing the second dielectric material in the first plurality of cavities and the second plurality of cavities, the second dielectric material in contact with the first conductive material; and depositing the second conductive material in the first plurality of cavities and the second plurality of cavities, the second conductive material for a second conductive plate of the respective capacitors, where the second conductive material is in contact with the second dielectric material and separated from the first conductive material by the second dielectric material. In some examples, the means for depositing may include a controller-enabled manufacturing system or subsystem that can perform deposition of the materials described in Aspect 1 and/or Aspect 2. In some examples, the means for deposition may include one or more of an external memory controller (e.g., external memory controller 120), a device memory controller (e.g., device memory controller 155, another controller, and/or one or more other devices for depositing the recited materials using one or more deposition applicators, deposition maskers, etc).

Aspect 3: The method or apparatus of any of aspects 1 through 2, where the first conductive material, the second dielectric material, and the second conductive material extend farther into the second plurality of cavities than the first plurality of cavities based at least in part on the second distance being greater than the first distance.

Aspect 4: The method or apparatus of any of aspects 1 through 3, further including operations, features, circuitry, logic, means, or instructions, or any combination thereof for etching a cavity through the stack of layers, where the first conductive material, the second dielectric material, and the second conductive material are deposited using the cavity through the stack of layers. In some examples, the means for etching may include a controller-enabled manufacturing system or subsystem that can perform etching of the materials described in Aspect 1 and/or Aspect 4. In some examples, the means for etching may include one or more of an external memory controller (e.g., external memory controller 120), a device memory controller (e.g., device memory controller 155, another controller, one or more other devices for etching the recited materials using one or more etchant applicators, etchant maskers, etc).

Aspect 5: The method or apparatus of aspect 4, further including operations, features, circuitry, logic, means, or instructions, or any combination thereof for depositing a third conductive material in the cavity through the stack of layers, the third conductive material coupled with each of the respective capacitors and for coupling the respective capacitors with a voltage source. In some examples, the means for depositing may include a controller-enabled manufacturing system or subsystem that can perform deposition of the materials described in Aspect 1 and/or Aspect 5. In some examples, the means for deposition may include one or more of an external memory controller (e.g., external memory controller 120), a device memory controller (e.g., device memory controller 155, another controller, and/or one or more other devices for depositing the recited materials using one or more deposition applicators, deposition maskers, etc).

Aspect 6: The method or apparatus of aspect 5, where the second conductive material and the third conductive material are a same conductive material.

Aspect 7: The method or apparatus of aspect 5, where the second conductive material and the third conductive material are different conductive materials.

Aspect 8: The method or apparatus of any of aspects 1 through 7, where the first material is etched for a first duration and the portion of the first dielectric material is etched for a second duration that is greater than the first duration and the second distance is greater than the first distance based at least in part on the second duration being greater than the first duration.

Aspect 9: The method or apparatus of any of aspects 1 through 7, further including operations, features, circuitry, logic, means, or instructions, or any combination thereof for implanting the first material with one or more materials to form a third material the layers of the first material and the second material, where removing the first material includes operations, features, circuitry, logic, means, or instructions, or any combination thereof for etching the third material to form the first plurality of cavities. In some examples, the means for implanting may include a controller-enabled manufacturing system or subsystem that can perform implanting of the materials described in Aspect 1 and/or Aspect 7. In some examples, the means for deposition may include one or more of an external memory controller (e.g., external memory controller 120), a device memory controller (e.g., device memory controller 155, another controller, and/or one or more other devices for implanting the recited materials using one or more implanting applicators, implanting maskers, etc. In some examples, the means for etching may include a controller-enabled manufacturing system or subsystem that can perform etching of the materials described in Aspect 1 and/or Aspect 7. In some examples, the means for etching may include one or more of an external memory controller (e.g., external memory controller 120), a device memory controller (e.g., device memory controller 155, another controller, one or more other devices for etching the recited materials using one or more etchant applicators, etchant maskers, etc.

Aspect 10: The method, apparatus, or non-transitory computer-readable medium of any of aspects 1 through 9, where the first conductive material and the second conductive material are a same conductive material.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 11: An apparatus, including: a digit line extending through a plurality of levels of a memory array, where the digit line is coupled with a respective memory cell of the memory array at each level of the plurality of levels; and a first memory cell at a first level of the plurality of levels, the first memory cell including: a channel portion coupled with the digit line; and a capacitor coupled with the channel portion and operable to store a logic state of the memory cell, where a portion of the capacitor extends into a dielectric layer between the first level and a second level of the plurality of levels and the portion of the capacitor is located between the channel portion and a word line coupled with a second channel portion of a second memory cell at the second level.

Aspect 12: The apparatus of aspect 11, where a second portion of the capacitor is located at the first level between the channel portion and a voltage source coupled with the capacitor.

Aspect 13: The apparatus of aspect 12, where a length of the second portion of the capacitor in a first direction is less than a length of the channel portion in the first direction.

Aspect 14: The apparatus of any of aspects 11 through 13, where the capacitor is operable to shield the channel portion from a disturbance caused by the word line coupled with the second channel portion based at least in part on the capacitor being coupled with a ground voltage source and the portion of the capacitor being located between the channel portion and the word line.

Aspect 15: The apparatus of any of aspects 11 through 14, where: a first portion of the dielectric layer is located between the portion of the capacitor and the channel portion, and a second portion of the dielectric layer is located between the portion of the capacitor and the word line coupled with the second channel portion.

Aspect 16: The apparatus of any of aspects 11 through 15, where a portion of the dielectric layer is located between the portion of the capacitor and the digit line.

Aspect 17: The apparatus of any of aspects 11 through 16, where the capacitor includes a first conductive plate, a second conductive plate, and a dielectric material between the first conductive plate and the second conductive plate, and a respective portion of each of the first conductive plate, the second conductive plate, and the dielectric material extends into the dielectric layer and is located between the channel portion and the word line coupled with the second channel portion.

Aspect 18: The apparatus of any of aspects 11 through 17, where a height of the capacitor is greater than a height of the channel portion based at least in part on the portion of the capacitor extending into the dielectric layer.

Aspect 19: The apparatus of any of aspects 11 through 18, further including: a cell plate extending through the plurality of levels, where the cell plate is coupled with a respective capacitor of the respective capacitor at each level of the plurality of levels.

An apparatus is described. The following provides an overview of aspects of the apparatus as described herein:

Aspect 20: An apparatus, including: a plurality of levels of a memory array, each level of the memory array separated from another level of the memory array by a respective dielectric layer; and a first memory cell at a first level of the plurality of levels, the first memory cell including a channel portion operable to couple a capacitor of the first memory cell to a digit line, where a first portion of the capacitor is located at the first level between the channel portion and a voltage source coupled with the first memory cell and a second portion of the capacitor is in a cavity in the dielectric layer between the first level and a second level of the plurality of levels.

Aspect 21: The apparatus of aspect 20, where the second portion of the capacitor is located between the channel portion and a word line coupled with a second channel portion of a second memory cell at the second level based at least in part on being in the cavity in the dielectric layer.

Aspect 22: The apparatus of aspect 21, where: a first portion of the dielectric layer is located between the portion of the capacitor and the channel portion, and a second portion of the dielectric layer is located between the portion of the capacitor and the word line coupled with the second channel portion.

Aspect 23: The apparatus of aspect 22, where a thickness of the first portion of the dielectric layer and a thickness of the second portion of the dielectric layer are within a first nm range.

Aspect 24: The apparatus of any of aspects 20 through 23, where a length of the first portion of the capacitor in a first direction that is parallel to a substrate over which the memory array is located is less than a length of the channel portion in the first direction.

Aspect 25: The apparatus of aspect 24, where a length of the second portion of the capacitor in the first direction is greater than the length of the channel portion in the first direction.

Aspect 26: The apparatus of any of aspects 20 through 25, where a length of the capacitor in a second direction that is orthogonal to a substrate over which the memory array is located is greater than a length of the channel portion in the second direction.

Aspect 27: The apparatus of any of aspects 20 through 26, where the capacitor includes a first conductive plate, a second conductive plate, and a dielectric material between the first conductive plate and the second conductive plate, and a respective portion of each of the first conductive plate, the second conductive plate, and the dielectric material is in the cavity in the dielectric layer.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a digit line extending through a plurality of levels of a memory array, wherein the digit line is coupled with a respective memory cell of the memory array at each level of the plurality of levels; and
a first memory cell at a first level of the plurality of levels, the first memory cell comprising:
a channel portion coupled with the digit line; and
a capacitor coupled with the channel portion and operable to store a logic state of the first memory cell, wherein a portion of the capacitor extends into a dielectric layer between the first level and a second level of the plurality of levels and the portion of the capacitor is located between the channel portion and a word line coupled with a second channel portion of a second memory cell at the second level, wherein the channel portion is between the portion of the capacitor and a second word line coupled with the channel portion of the first memory cell at the first level.

2. The apparatus of claim 1, wherein a portion of the dielectric layer is located between the portion of the capacitor and the digit line.

3. The apparatus of claim 1, wherein:
the capacitor comprises a first conductive plate, a second conductive plate, and a dielectric material between the first conductive plate and the second conductive plate, and a respective portion of each of the first conductive plate, the second conductive plate, and the dielectric material extends into the dielectric layer and is located between the channel portion and the word line coupled with the second channel portion.

4. The apparatus of claim 1, wherein a height of the capacitor is greater than a height of the channel portion based at least in part on the portion of the capacitor extending into the dielectric layer.

5. An apparatus, comprising:
a digit line extending through a plurality of levels of a memory array, wherein the digit line is coupled with a respective memory cell of the memory array at each level of the plurality of levels; and
a first memory cell at a first level of the plurality of levels, the first memory cell comprising:
  a channel portion coupled with the digit line; and
  a capacitor coupled with the channel portion and operable to store a logic state of the first memory cell, wherein a portion of the capacitor extends into a dielectric layer between the first level and a second level of the plurality of levels and the portion of the capacitor is located between the channel portion and a word line coupled with a second channel portion of a second memory cell at the second level, wherein a second portion of the capacitor is located at the first level between the channel portion and a voltage source coupled with the capacitor.

6. The apparatus of claim 5, wherein a length of the second portion of the capacitor in a first direction is less than a length of the channel portion in the first direction.

7. An apparatus, comprising:
a digit line extending through a plurality of levels of a memory array, wherein the digit line is coupled with a respective memory cell of the memory array at each level of the plurality of levels; and
a first memory cell at a first level of the plurality of levels, the first memory cell comprising:
  a channel portion coupled with the digit line; and
  a capacitor coupled with the channel portion and operable to store a logic state of the first memory cell, wherein a portion of the capacitor extends into a dielectric layer between the first level and a second level of the plurality of levels and the portion of the capacitor is located between the channel portion and a word line coupled with a second channel portion of a second memory cell at the second level, wherein the capacitor is operable to shield the channel portion from a disturbance caused by the word line coupled with the second channel portion based at least in part on the capacitor being coupled with a ground voltage source and the portion of the capacitor being located between the channel portion and the word line.

8. An apparatus, comprising:
a digit line extending through a plurality of levels of a memory array, wherein the digit line is coupled with a respective memory cell of the memory array at each level of the plurality of levels; and
a first memory cell at a first level of the plurality of levels, the first memory cell comprising:
  a channel portion coupled with the digit line; and
  a capacitor coupled with the channel portion and operable to store a logic state of the first memory cell, wherein a portion of the capacitor extends into a dielectric layer between the first level and a second level of the plurality of levels and the portion of the capacitor is located between the channel portion and a word line coupled with a second channel portion of a second memory cell at the second level, wherein:
  a first portion of the dielectric layer is located between the portion of the capacitor and the channel portion, and
  a second portion of the dielectric layer is located between the portion of the capacitor and the word line coupled with the second channel portion.

9. An apparatus, comprising:
a digit line extending through a plurality of levels of a memory array, wherein the digit line is coupled with a respective memory cell of the memory array at each level of the plurality of levels;
a first memory cell at a first level of the plurality of levels, the first memory cell comprising:
  a channel portion coupled with the digit line; and
  a capacitor coupled with the channel portion and operable to store a logic state of the first memory cell, wherein a portion of the capacitor extends into a dielectric layer between the first level and a second level of the plurality of levels and the portion of the capacitor is located between the channel portion and a word line coupled with a second channel portion of a second memory cell at the second level; and
a cell plate extending through the plurality of levels, wherein the cell plate is coupled with a respective capacitor at each level of the plurality of levels.

10. An apparatus, comprising:
a plurality of levels of a memory array, each level of the memory array separated from another level of the memory array by a respective dielectric layer; and
a first memory cell at a first level of the plurality of levels, the first memory cell comprising a channel portion operable to couple a capacitor of the first memory cell to a digit line,
wherein a first portion of the capacitor is located at the first level between the channel portion and a voltage source coupled with the first memory cell and a second portion of the capacitor is in a cavity in the respective dielectric layer between the first level and a second level of the plurality of levels, wherein the second portion of the capacitor is located between the channel portion and a word line coupled with a second channel portion of a second memory cell at the second level based at least in part on being in the cavity in the respective dielectric layer.

11. The apparatus of claim 10, wherein:
a length of the first portion of the capacitor in a first direction that is parallel to a substrate over which the memory array is located is less than a length of the channel portion in the first direction, and
a length of the second portion of the capacitor in the first direction is greater than the length of the channel portion in the first direction.

12. The apparatus of claim 11, wherein a length of the capacitor in a second direction that is orthogonal to a substrate over which the memory array is located is greater than a length of the channel portion in the second direction.

13. The apparatus of claim 10, wherein:
the capacitor comprises a first conductive plate, a second conductive plate, and a dielectric material between the first conductive plate and the second conductive plate, and
a respective portion of each of the first conductive plate, the second conductive plate, and the dielectric material is in the cavity in the respective dielectric layer.

14. The apparatus of claim 10, wherein:

a first portion of the respective dielectric layer is located between the second portion of the capacitor and the channel portion, and a second portion of the respective dielectric layer is located between the second portion of the capacitor and the word line coupled with the second channel portion.

15. The apparatus of claim 14, wherein a thickness of the first portion of the respective dielectric layer and a thickness of the second portion of the respective dielectric layer are within a first nanometer range.

16. A method, comprising:

forming a cavity through a stack of layers over a substrate, the stack of layers comprising layers of a first material and a second material and layers of a first dielectric material, wherein the second material is for a channel portion of a memory cell at a respective layer of the layers of the first material and the second material, and wherein the second material for the channel portion is coupled with a conductive material that extends through the stack of layers;

removing the first material from the stack of layers, using the cavity through the stack of layers, to form a first plurality of cavities in the stack of layers;

removing a portion of the first dielectric material, using the cavity through the stack of layers, to form a second plurality of cavities in the stack of layers, wherein cavities of the first plurality of cavities extend into the layers of the first material and the second material a first distance and cavities of the second plurality of cavities extend into the first dielectric material a second distance that is greater than the first distance; and forming a first conductive material, a second dielectric material, and a second conductive material in the first plurality of cavities and the second plurality of cavities, using the cavity through the stack of layers, to form respective capacitors coupled with respective channel portions of respective memory cells and for storing a logic state of the respective memory cells.

17. The method of claim 16, wherein forming the first conductive material, the second dielectric material, and the second conductive material to form the respective capacitors comprises:

forming the first conductive material in the first plurality of cavities and the second plurality of cavities, the first conductive material for a first conductive plate of the respective capacitors, wherein the first conductive material is in contact with the second material and the first dielectric material;

forming the second dielectric material in the first plurality of cavities and the second plurality of cavities, the second dielectric material in contact with the first conductive material; and forming the second conductive material in the first plurality of cavities and the second plurality of cavities, the second conductive material for a second conductive plate of the respective capacitors, wherein the second conductive material is in contact with the second dielectric material and separated from the first conductive material by the second dielectric material.

18. The method of claim 16, wherein the first conductive material, the second dielectric material, and the second conductive material extend farther into the second plurality of cavities than the first plurality of cavities based at least in part on the second distance being greater than the first distance.

19. The method of claim 16, wherein:

removing the first material is based at least in part on etching for a first duration and removing the portion of the first dielectric material is based at least in part on etching for a second duration that is greater than the first duration, and the second distance is greater than the first distance based at least in part on the second duration being greater than the first duration.

20. The method of claim 16, further comprising:

implanting the first material with one or more materials to form a third material at the layers of the first material and the second material, wherein removing the first material comprises:

etching the third material to form the first plurality of cavities.

21. The method of claim 16, wherein the first conductive material and the second conductive material are a same conductive material.

22. The method of claim 16, further comprising:

forming a third conductive material in the cavity through the stack of layers, the third conductive material coupled with each of the respective capacitors and for coupling the respective capacitors with a voltage source.

23. The method of claim 22, wherein the second conductive material and the third conductive material are a same conductive material.

* * * * *